United States Patent
Dalla Longa et al.

(10) Patent No.: US 11,245,410 B1
(45) Date of Patent: Feb. 8, 2022

(54) SYSTEM AND METHOD FOR CURRENT DIGITAL-TO-ANALOG CONVERTER

(71) Applicant: Infineon Technologies AG, Neubiberg (DE)

(72) Inventors: Matteo Dalla Longa, Villach (AT); Francesco Conzatti, Villach (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 17/117,886

(22) Filed: Dec. 10, 2020

(51) Int. Cl.
*H03M 1/50* (2006.01)
*H03M 1/06* (2006.01)
*H03M 1/66* (2006.01)

(52) U.S. Cl.
CPC ........... *H03M 1/066* (2013.01); *H03M 1/66* (2013.01)

(58) Field of Classification Search
USPC .......................................................... 341/166
See application file for complete search history.

(56) References Cited

U.S. PATENT DOCUMENTS

| | | | | |
|---|---|---|---|---|
| 6,924,760 | B1* | 8/2005 | McLeod | H03M 1/066 341/144 |
| 7,102,557 | B1* | 9/2006 | Frith | H03M 1/804 327/337 |
| 9,178,528 | B1* | 11/2015 | Waltari | H03M 1/662 |
| 9,590,590 | B2* | 3/2017 | Li | H03M 3/396 |
| 2016/0336927 | A1* | 11/2016 | Ho | H03M 1/0872 |

OTHER PUBLICATIONS

Adams, Robert, et al., "A 113-dB SNR Oversampling DAC With Segmented Noise-Shaped Scrambling", IEEE Journal at Solid-State Circuits, vol. 33, No. 12, pp. 1871-1878, Dec. 1998.
Chang, Hairong, et al., "Feasibility analysis of the Fixed-width Pulse RZ Feedback to Reduce Clock Jitter Effects in Lowpass Continuous-Time ΔΣ Modulators", IEEE 56th International Midwest Symposium on Circuits and Systems (MWSCAS), Columbus, OH, Aug. 4-7, 2013, pp. 245-248.
Klumperink, Eric, et al., "Reduction of 1/f Noise by Switched Biasing: an Overview", 16th Workshop on Circuits, Systems and Signal Processing, ProRISC, Nov. 2005, 9 pages.
Oliaei, Omid, "Sigma-Delta Modulator With Spectrally Shaped Feeback", IEEE Transactions on Circuits and Systems-ll: Analog and Digital Signal Processing, vol. 50, No. 9, Sep. 2003, 13 pages.
Ortmanns, Maurits, et al., "A Continuous-Time ΣΔ Modulator with Reduced Sensitivity to Clock Jitter Through SCR Feedback", IEEE Trans. Circuits System I: Regular Papers, vol. 52, No. 5, May 2005, pp. 875-884.
Tanihata, Mitsuhiro, et al., "A Feedback-Signal Shaping Technique for Multi-level Continuous-Time Delta-Sigma Modulators with Clock Jitter", Proc, of 36th Inter. Symp. on Multiple-Valued Logic (ISMVL'06), May 17-20, 2006, 5 pages.

* cited by examiner

Primary Examiner — Jean B Jeanglaude
(74) Attorney, Agent, or Firm — Slater Matsil, LLP

(57) ABSTRACT

In accordance with an embodiment, a circuit includes a current digital-to-analog converter (DAC) having a current switching network coupled to a current DAC output, a first cascode current source coupled between a first supply node and the current switching network, a second cascode current source between a second supply node and the current switching network, and a shorting switch coupled between a first cascode node of the first cascode current source, and a second cascode node of the second cascode current source.

20 Claims, 7 Drawing Sheets

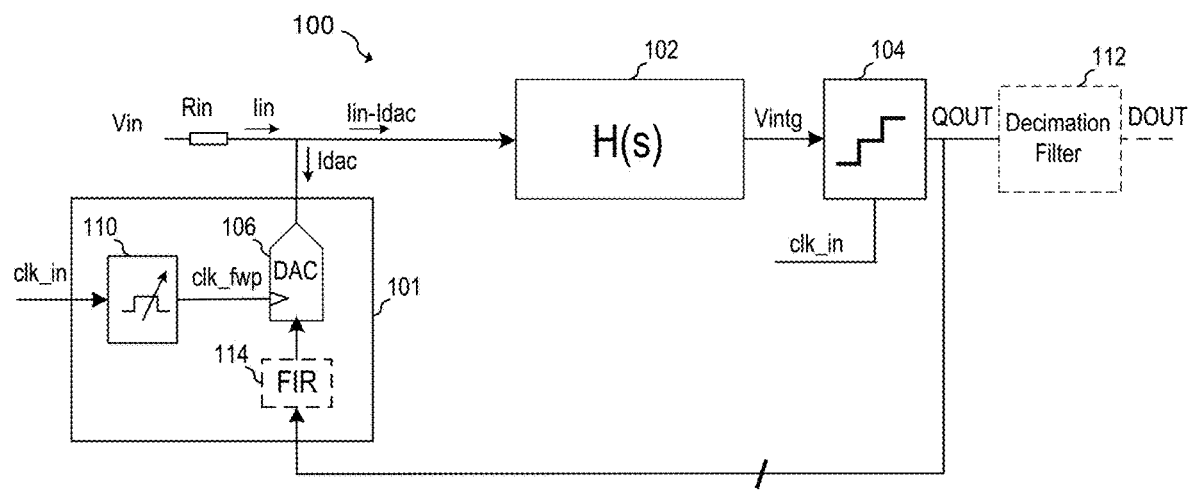
*FIG. 1A*
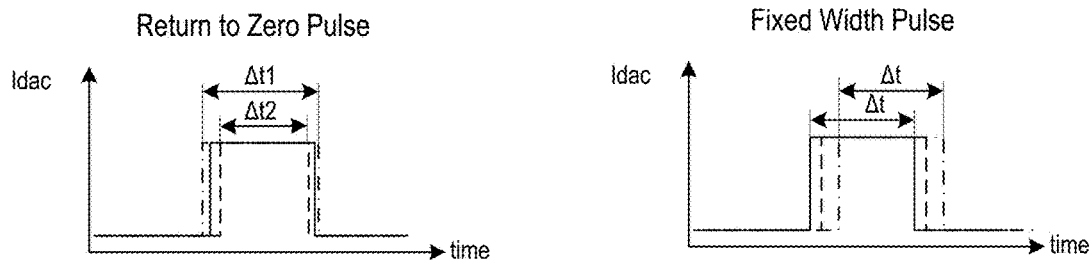
*FIG. 1B*   *FIG. 1C*

SYSTEM AND METHOD FOR CURRENT DIGITAL-TO-ANALOG CONVERTER

TECHNICAL FIELD

The present invention relates generally to electronic systems, and, in particular embodiments, to a fixed-width-pulse return-to-zero (RZ) digital-to-analog-converter (DAC) for a continuous-time delta-sigma ADC.

BACKGROUND

Analog-to-Digital converters are used to convert real-world analog signals into the digital domain for many types of systems ranging from low frequency systems that process the output of pressure sensors and microphones to high frequency systems such as RF and radar systems that process received RF signals. Many such systems rely on high performance ADCs to in order to meet important design specifications including sampling rate, number of bits, linearity, noise, and power consumption. In the design of such a system, an ADC architecture is generally selected that is suitable to meet the particular combination of design requirements relevant to the particular system.

One particular ADC architecture well suited to high-performance, low-voltage and low power systems is the continuous-time delta-sigma converter (CT-DSADC). The power consumption of a CT-DSADC may be lower than a comparable switched-capacitor discrete time delta-sigma ADC due to relaxed speed and bandwidth requirements of the CT-DSADC's internal amplifiers. Moreover, the absence of capacitor switching reduces the amount of noise coupled into the CT-DSADC during operation. As such, a CT-DSADCs is capable of having a lower noise floor than a discrete time delta-sigma ADC for a given level of power consumption.

However, it is well known that CT-DSADCs are sensitive to clock jitter due to the continuous integration of the DAC feedback pulse. As such, design precautions are taken to reduce the effect of clock jitter on the performance of a CT-DSADC.

SUMMARY

In accordance with an embodiment, a circuit includes a current digital-to-analog converter (DAC) having a current switching network coupled to a current DAC output, a first cascode current source coupled between a first supply node and the current switching network, a second cascode current source between a second supply node and the current switching network, and a shorting switch coupled between a first cascode node of the first cascode current source, and a second cascode node of the second cascode current source.

In accordance with another embodiment, a method of operating a current digital-to-analog converter (DAC) including a current switching network coupled to a current DAC output, a first cascode current source coupled between a first supply node and the current switching network, a second cascode current source between a second supply node and the current switching network, and a shorting switch coupled between a first cascode node of the first cascode current source, and a second cascode node of the second cascode current source includes the steps of configuring the current switching network according to a current DAC input value while the shorting switch is closed; opening the shorting switch after configuring the current switching network to cause a current proportional to the DAC input value to flow through the current DAC output; and closing the shorting switch a predetermined period of time after opening the shorting switch to inhibit the current proportional to the current DAC input value from flowing through the current DAC output.

In accordance with a further embodiment, a continuous-time delta-sigma converter, includes: at least one continuous-time integrator; a comparator coupled to an output of the at least one continuous-time integrator; and a current DAC including: a first current source coupled to an output of the current DAC via a first switch at a first current source output node, a second current source coupled to the output of the current DAC via a second switch at a second current source output node, a shorting switch coupled between a first internal node of the first current source, and a second internal node of the second current source, and a programmable pulse generator coupled to a control node of the shorting switch, where the programmable pulse generator is configured to gate an output current of the current DAC by opening the shorting switch for a predetermined period of time.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a continuous-time delta-sigma ADC (CT-DSADC) according to an embodiment; FIG. 1B illustrates an exemplary RZ current pulse; and FIG. 1C illustrates an RZ current pulse according to an embodiment;

Figure 2A:
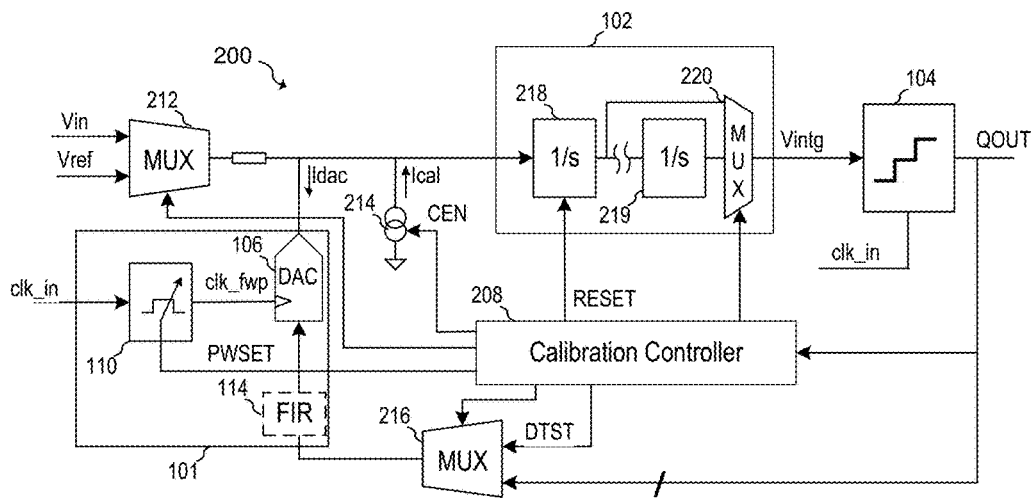
FIG. 2A illustrates a CT-DSADC according to an embodiment having circuitry that calibrates the fixed pulse width the RZ current pulse.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in the specific context of a continuous-time delta-sigma converter. However, embodiments disclosed herein can also be applied to other data converter architectures, DACs, and other electronic systems that generate or utilize pulses having a controlled pulse width and/or are sensitive to jitter.

In an embodiment of the present invention, the jitter tolerance of a CT-DSADC is improved by controlling the output current of a current DAC using a return-to-zero (RZ) pulse having a fixed pulse width. The fixed pulse width is generated using a tunable delay element in a manner in which the fixed pulse-width is insensitive to clock jitter. In various embodiments, the width of the pulse is calibrated by comparing the output current of the current DAC to a reference current and adjusting the delay of the tunable delay element until the currents are substantially equal.

In an embodiment, the current DAC is implemented as a three-state current steering DAC that includes an output stage, output switches, two cascode current sources, and a shorting switch connected between internal nodes of the two cascode current source. During operation, a DAC input word is applied to the output switches while the current produced by the two cascode current sources is bypassed from output stage via the shorting switch. The DAC output is activated when the RZ pulse is asserted by opening the shorting switch, which causes the bypassed current to be steered to the DAC output stage, and then deactivated by closing the shorting switch, which causes the output current to be steered back to the shorting switch. Embodiment current DACs advantageously reduce intersymbol interference (ISI) or DAC output variation with respect to current DAC input values, codes or sequences, and relax the timing and rise/fall time requirements for driving the current DAC output switches. The relaxed timing and rise/fall time requirements allow for physically larger output transistors. This leads to increased headroom, the ability to use lower supply voltages to operate the current DAC, and reduced power consumption.

FIG. 1A illustrates a CT-DSADC 100 according to an embodiment of the present invention. As shown, CT-DSADC 100 includes a continuous-time filter 102, a quantizer 104, and an RZ current DAC system 101. During operation input voltage Vin is applied to resistor Rin at the input of CT-DSADC 100 to form input current Iin. The difference between input current Iin and output current Idac of current DAC system 101 is filtered by continuous-time filter 102. Quantizer 104 quantizes the output Vintg of continuous-time filter 102 to produce a digital quantized output signal QOUT, which forms the input word to current DAC system 101 during the next conversion cycle. In some embodiments continuous-time filter 102, quantizer 104 and RZ current DAC system 101 form a continuous-time delta-sigma modulator in which output signal QOUT is an oversampled, noise-shaped signal. In such embodiments, CT-DSADC 100 (as well as the other CT-DSADCs disclosed herein) may also include optional decimation filter 112, which low pass filters and decreases the sample rate of output signal QOUT. Optional decimation filter 112 may be implemented using decimation filter circuits and systems known in the art.

Continuous time filter 102 is configured to implement a continuous-time transfer function H(s) using continuous-time filter structures known in the art, such as active filters implemented using operational amplifiers and capacitors, gmC filter structures, or other known active filter structures. Alternatively, passive filter structures could be used. In some embodiments, continuous-time filter 102 includes one or more continuous-time integrators.

Quantizer 104 may be implemented using quantizer circuits known in the art. For example, quantizer 104 may be a single-bit quantizer implemented using a comparator circuit, or may be a multi-bit quantizer implemented using a flash ADC comprising plurality of comparator circuits. In the embodiment depicted in FIG. 1A, quantizer 104 is configured to quantize signal Vintg on the either the rising or falling edge of clock clk_in.

Current DAC system 101 includes current DAC 106, pulse generator 110, and optional finite impulse response (FIR) filter 114. During operation, pulse generator 110 produces signal clk_fwp that includes a fixed width RZ pulse in response to either a rising edge or a falling edge of clock clk_in. This fixed width RZ pulse causes current DAC 106 to produce a corresponding output current Idac when the RZ pulse is asserted. As such, the signal clk_fwp is configured to gate the output current of the current DAC. Pulse generator 110 may be implemented as a programmable pulse generator in which the fixed pulse width provided by pulse generator 110 is adjustable, as explained with respect to embodiments below. Optional FIR filter 114 filters quantized signal QOUT in order to reduce the magnitude of the DAC steps by filtering the high frequency content of the feedback signal. The addition of the FIR filter is beneficial in terms of reducing the effect of clock jitter (especially in the case of a non-return to zero DAC), and relaxing operational amplifier speed requirements. The FIR filter may be implemented using digital filter circuits known in the art.

In various embodiments, pulse generator 110 produces a fixed width RZ pulse that advantageously mitigates both ISI and jitter. ISI is lower using an RZ pulse compared to using a non-return to zero (NRZ) pulse because the shape of RZ pulse causing DAC 106 to produce a rising and falling current transition is the same for each conversion cycle and independent from the digital input provided DAC 106. An NRZ pulse, on the other hand, may omit a rising and/or falling transition when the digital input provided current DAC 106 is the same in two consecutive conversion cycles. This difference in the number of rising and falling edges per cycle may cause the net charge produced by the DAC to be data dependent for NRZ pulses.

Using the pulse generator 110 to produce a fixed pulse width mitigates the effect of jitter on the amount of charge delivered by current DAC 106 as illustrated in the descriptive diagrams of FIGS. 1B and 1C. FIG. 1B illustrates a group of RZ pulses generated using a first edge of a jittered clock to produce the rising edge of the RZ pulse and using a second edge of the jittered clock to produce the falling edge of the RZ pulse. Since both the rising and falling edge of the pulse is based on the jittered clock, the width of the RZ pulse may vary according to the jittered clock. For example, as shown in FIG. 1B, a first pulse may have a first pulse width of $\Delta t1$, and a second pulse may have a second pulse width $\Delta t2$ different from the first pulse width.

FIG. 1C shows a group of RZ pulses that are generated using a first edge of the jittered clock to produce the rising edge of the RZ pulse. However, instead of using the second edge of the jittered clock to produce the falling edge of the RZ pulse, a fixed time delay is used instead according to embodiments of the present invention. Accordingly, even though the rising edge of each pulse is jittered according to the jittered clock, the pulse width $\Delta t$ of each RZ pulse remains the same assuming a constant delay. Thus, the amount of charge delivered by current DAC 106 during each conversion cycle becomes independent (or significantly less dependent) on the jitter of input clock clk_in.

In various embodiments, the width of the pulses generated by pulse generator 110 may be calibrated in order to ensure a constant loop gain of the CT-DSADC. FIG. 2A illustrates a CT-DSADC that is configured to calibrate the pulse width of the pulses generated by pulse generator 110. Similar to CT-DSADC 100 shown in FIG. 1A, CT-DSADC 200 includes continuous-time filter 102, quantizer 104, and RZ current DAC system 101. CT-DSADC 200 may also include an optional decimation filter 112, which has been omitted from FIG. 2A for simplicity of illustration. Additional circuitry used to calibrate pulse generator 110 includes calibration controller 208, test multiplexers 212, 216 and 220, and reference current source 214.

During calibration, calibration controller 208 (also referred to as a "control circuit") activates calibration current source 214 via activation signal CEN and provides a predetermined input code to current DAC 106 via multiplexer 216. The difference in charge produced by current DAC 106 and the charge produced by reference current source 214 is integrated by the continuous-time loop filter 102. During calibration, calibration controller 208 adjusts the pulse width of RZ pulses produced by pulse generator 110 via pulse width control signal PWSET based on the output QOUT of quantizer 104. In some embodiments, calibration controller 208 adjusts pulse width control signal PWSET until output QOUT of quantizer 104 attains a predetermined value and/or a predetermined average value. While continuous-time loop filter 102 and current DAC 106 are depicted as single-ended circuits for simplicity of illustration, it should be understood that CT-DSADC 200, as well as the other CT-DSADCs disclosed herein, could be implemented using differential circuits using various differential circuit design techniques known in the art.

During calibration, calibration controller 208 may route a predetermined input voltage Vref to the input of the CT-DSADC 200 via multiplexer 212. Predetermined input voltage Vref may be ground voltage, a mid-rail voltage, or any other voltage. Similarly, calibration controller 208 may route a predetermined input code DTST to current DAC 106 via multiplexer 216 during calibration. Predetermined input code DTST may be any input code configured to cause current DAC 106 to produce a current. During normal operation of CT-DSADC 200, multiplexer 212 routes the system input voltage Vin to CT-DSADC, and multiplexer 216 routes output signal QOUT to the input of current DAC 106.

In some embodiments, continuous-time filter 102 is reset at the beginning of a calibration cycle and/or is reconfigured during calibration. As shown, continuous-time filter 102 includes a plurality of continuous-time integrators 218 and 219. While only two integrators are shown, it should be understood that continuous-time filter 102 may include greater than two integrators depending on the particular system and its specifications. In some embodiments, the first integrator 218 remains active during calibration, while subsequent integrators (including integrator 219) are bypassed. Subsequent integrator 219 may be bypassed by routing the output of first integrator 218 to the output of continuous-time filter 102 via multiplexer 220; however, it should be understood that bypassing subsequent integrator 219 could be implemented using other circuits besides a multiplexer. During calibration, calibration controller 208 may reset integrator 218 via reset signal RESET prior to its integrating the difference between the charge supplied by current DAC 106 and calibration current source 214.

Figure 2B:
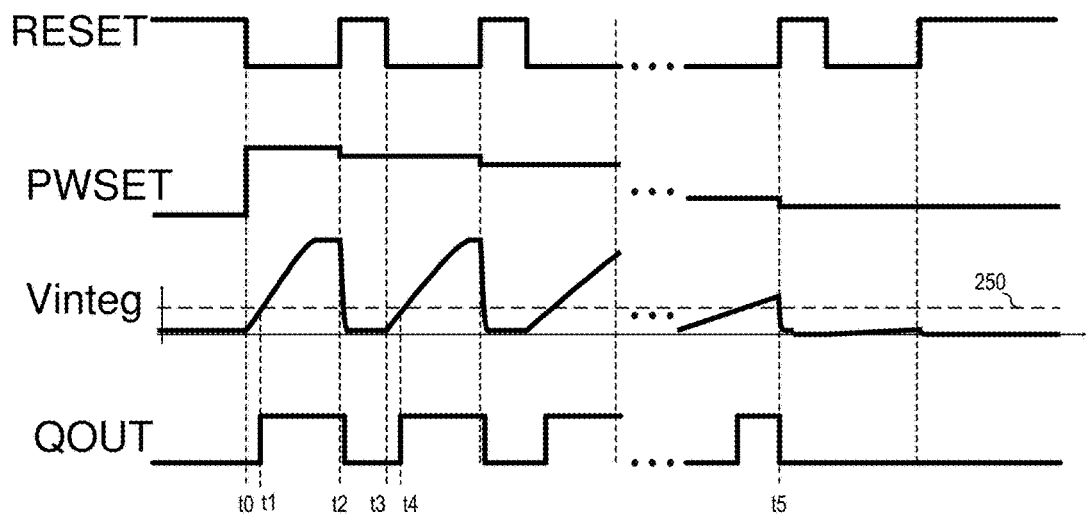
FIG. 2B illustrates a timing diagram showing the calibration operation of the CT-DSADC of FIG. 2A.

FIG. 2B illustrates a waveform diagram showing signals RESET, PWSET, Vinteg and QOUT generated by CT-DSADC 200 during a calibration cycle. Prior to time to, calibration controller 208 asserts reset signal RESET, which sets first integrator 218 of continuous-time filter 102 to an initial value (e.g. zero). At time to, calibration controller 208 sets pulse width control signal PWSET to an initial pulse width value, and de-asserts reset signal RESET, which causes first integrator 218 to integrate the difference between the charge supplied by current DAC 106 and calibration current source 214. As shown, output Vintg of continuous-time filter 102 increases as it integrates the difference charge difference. At time t1, the integrated charge difference exceeds a threshold 250 of quantizer 104, and output signal QOUT goes high. For the sake of simplicity of illustration, quantizer 104 is represented in this example as a single bit quantizer; however, quantizer 104 could be implemented using more than one bit in alternative embodiments.

In response to output Vintg of continuous-time filter 102 exceeding quantization threshold 250, calibration controller 208 adjust the pulse width of the RZ pulse by decreasing the value of pulse width control signal PWSET for the next measurement cycle starting at time t2. It should be understood that while the value of PWSET is shown as being decreased in FIG. 2B, calibration controller 208 may be configured to increase pulse width of control signal PWSET during calibration. Moreover, the change in the value of pulse width control signal PWSET may represent an increase or a decrease in the pulse width produced by pulse generator 110 depending on the particular embodiment and its configuration.

At time t2, calibration controller 208 asserts reset signal RESET to once again reset first integrator 218 of continuous-time filter 102, thereby starting a second measurement cycle. At time t3, reset signal RESET is de-asserted by calibration controller 208, which allows the first integrator 218 of continuous-time filter 102 to integrate the difference between the charge supplied by current DAC 106 and calibration current source 214. Output Vintg of continuous-time filter 102 increases as it integrates the charge difference until threshold 250 of quantizer 104 is exceeded at time t4. Pulse width control signal PWSET continues to be decreased in subsequent cycles until output Vintg no longer exceeds threshold 250, which indicates that the charge generated by current DAC Idac is close to the charge generated by calibration current source 214. While FIG. 2B shows a calibration pulse width control signal PWSET determined using a decreasing linear search, it should be understood that other search strategies could be used. For example, pulse width control signal PWSET could be adjusted using an increasing linear search, a binary search, a coarse/fine search and/or using other search methods known in the art.

Figure 3A:
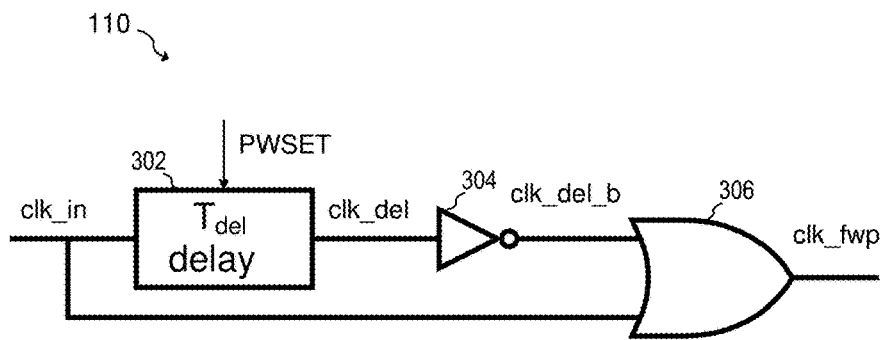
FIG. 3A illustrates a schematic of an embodiment pulse generator.

FIG. 3A illustrates a schematic of pulse generator 110 according to an embodiment that includes adjustable delay circuit 302, inverter 304, and OR gate 306. During operation, adjustable delay circuit 302 delays clock signal clk_in (also referred to as a "switch control signal") by a predetermined period of time to form delayed clock signal clk_del, and inverter 304 inverts delayed clock signal clk_del to form inverted delayed clock signal clk_del_b. OR gate 306 produces the RZ pulse at output clk_fwp by determining the logical OR of clock signal clk_in and inverted clock signal clk_del_b. The delay produced by adjustable delay circuit and the pulse width of the RZ pulse produced at output clk_fwp may be adjusted via pulse width control signal PWSET in the manner described above with respect to FIGS. 2A and 2B.

Figure 3B:
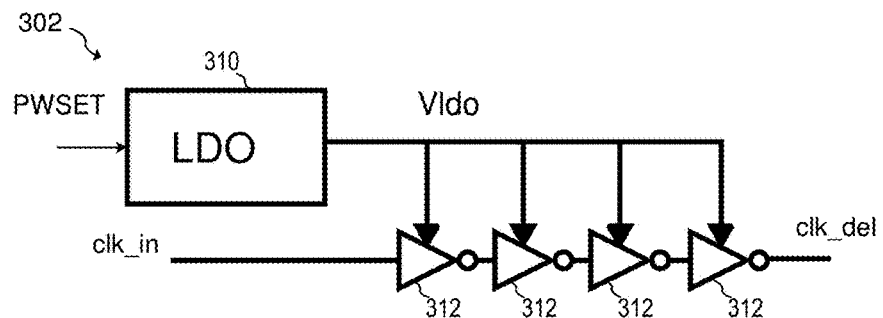
FIG. 3B illustrates a schematic of an embodiment adjustable delay circuit.

FIG. 3B illustrates a schematic of adjustable delay circuit 302 according to an embodiment. As shown, adjustable delay circuit 302 includes a low dropout regulator (LDO) circuit having an output coupled to the supply nodes of a plurality of cascaded inverters 312. During operation, pulse width control signal PWSET sets the output voltage of LDO 310 to produce a local supply voltage Vldo. In various embodiments, the delay of each inverter 312 is inversely proportional to local supply voltage Vldo. Thus, when local supply voltage Vldo is increased, the delay from clock signal clk_in to delayed clock signal clk_del decreases. On the other hand, when local supply voltage Vldo is decreased, the delay from clock signal clk_in to delayed clock signal clk_del increases.

In various embodiments, LDO regulator 310 may be implemented using LDO regulator circuits known in the art, such as a series pass transistor controlled by a feedback loop. Signal PWSET may be a digital signal that selects sets a reference voltage for the LDO regulator circuit. Alternatively, signal PWSET may be an analog voltage that is used as and/or is proportional to the LDO regulator reference voltage. Embodiments using LDO regulator 310 are advantageous in that the delay produced by adjustable delay circuit 302 is less sensitive to variations and disturbances on the power supply, especially in embodiments in which LDO 310 is configured to have a high power supply rejection ratio (PSRR). However, it should be understood using LDO 310 to produce the supply voltage for inverters 312 is just one example implementation. In alternative embodiments, other adjustable voltage reference circuits may be used in place of LDO 310. It should be further understood that the embodiment of FIG. 3B is just one example of how adjustable delay circuit 302 could be implemented. In alternative embodiments, other adjustable delay circuits known in the art could be used. For example, an adjustable delay circuit using a selectable number of series connected delay elements could be used. Adjustable delay circuit 302 could also be implemented using one or more inverters or buffers loaded with an adjustable capacitance.

Figure 3C:
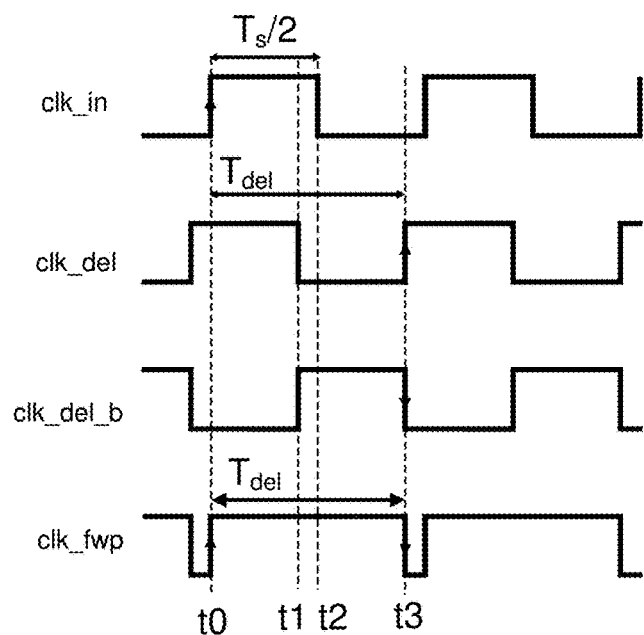
FIG. 3C illustrates a timing diagram showing the operation of the pulse generator of FIG. 3A.

FIG. 3C illustrates a timing diagram showing the operation of pulse generator of FIG. 3A. At the time to, output clk_fwp goes high at the rising edge of clock signal clk_in. Since clock signal clk_in is delayed by a time period $T_{del}$, inverted delayed clock signal clk_del_b goes high at time t1 prior to the falling edge of clock signal clk_in at time t2. Because of the overlapped assertion of clock signal clk_in and inverted delayed clock signal clk_del_b, the output clk_fwp of OR gate 306 remains high from time t1 to t2. At time t3, output clk_fwp goes low at the falling edge of inverted delayed clock clk_del_b, thereby producing an RZ pulse having a pulse width of $T_{del}$. In the depicted embodiment, time period $T_{del}$ is set to be greater than the pulse width of clock signal clk_in, which is shown to be $T_s/2$. Alternatively, time period $T_{del}$ may be less than the pulse width of clock signal clk_in by using a different logic.

Figure 4A:
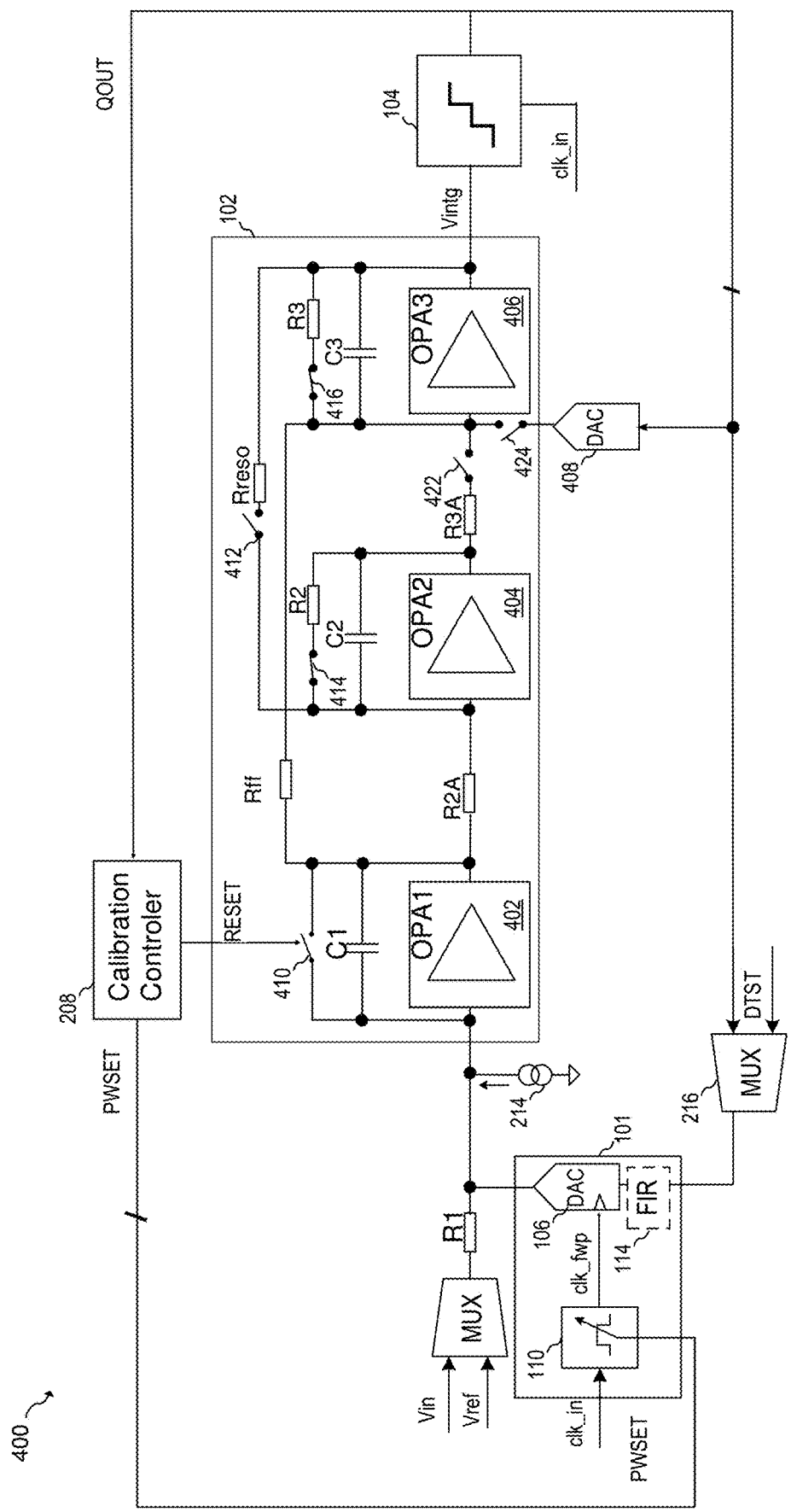
FIGS. 4A and 4B illustrate schematics of CT-DSADCs according to embodiments of the present invention.

FIG. 4A illustrates CT-DSADC 400, according to an embodiment of the present invention. CT-DSADC 400 is a specific example of CT-DSADC 200 shown in FIG. 2A in which continuous-time filter 102 is implemented as a third order filter, and an additional DAC 408 provides feedback to the last integration stage of continuous-time filter 102. As shown, continuous-time integrator includes a first integration stage comprising operational amplifier 402 and feedback capacitor C1, a second integration stage comprising operational amplifier 404 and feedback capacitor C2, and a third integration stage comprising operational amplifier 406 and feedback capacitor C3. Feedback resistor Rreso is coupled between the output of operational amplifier 406 and the input of operational amplifier 404, and feedforward resistor Rff is coupled between the input of operational amplifier 406 and the output of operational amplifier 402. Each of the first, second and third integration stages form continuous-time integrators. The values of feedback resistor Rreso and feedforward resistor Rff may be selected to shape the transfer function of continuous-time filter 102. In some embodiments, the values of all capacitors and resistors are selected to optimizer the signal to quantization noise ratio (SQNR) for a given over-sampling ratio (OSR).

During normal operation of CT-DSADC 400, continuous-time filter 102 is configured as a third order filter by closing switch 422 coupling the output of operational amplifier 404 of the second integration stage to the input of operational amplifier 406 of the third integration stage; and closing switch 424 coupling the output of DAC 408 to the input of operational amplifier 406 of the third integration stage. Switches 410, 414 and 416 remain open during normal operation.

In some embodiments, all three integrators may be active during calibration. However, in some embodiments, one or more integration stages may be bypassed and/or disabled to mitigate measurement difficulties that may result from the integration of offset in operational amplifiers 402, 404 or 406. For example, in one embodiment, continuous-time filter 102 is reconfigured to provide one stage of integration during calibration by opening switches 422, 412 and 424. Opening switch 422 disconnects the input of operational amplifier 406 of the third integration stage from the output of operational amplifier of 404 of the second integration stage; opening switch 412 disconnects feedback resistor Rreso; closing switch 414 couples resistor R2 in parallel with feedback capacitor C2 of the second integration stage; and closing switch 416 couples resistor R3 in parallel with feedback capacitor C3 of the third integration stage. This effectively disables the second and third integration stages and forms a feedforward path from the output of operational amplifier 402 of the first integration stage to the output of continuous-time filter 102 via resistors Rff and R3. In some embodiments, the input to operational amplifier 404 may be grounded or connected to a reference voltage during calibration via resistor R2A. During calibration, the first integration stage is reset by closing switch 410 via reset signal RESET as described above with respect to FIGS. 2A and 2B. It should be appreciated that the circuit depicted in FIG. 4A is just one of many possible ways to implement continuous-time filter 102 and to reduce the order of continuous-time filter 102 during calibration.

In one embodiment, clk_in has a clock frequency of 2 GHz, CT-DSADC 400 has and oversampling ratio of 64, and current DAC 106 is configured to have three levels. Alternatively, CT-DSADC 400 may have different clock frequency, a different oversampling ratio, and/or a different number of DAC levels depending on the particular embodiment and its specifications.

Figure 4B:
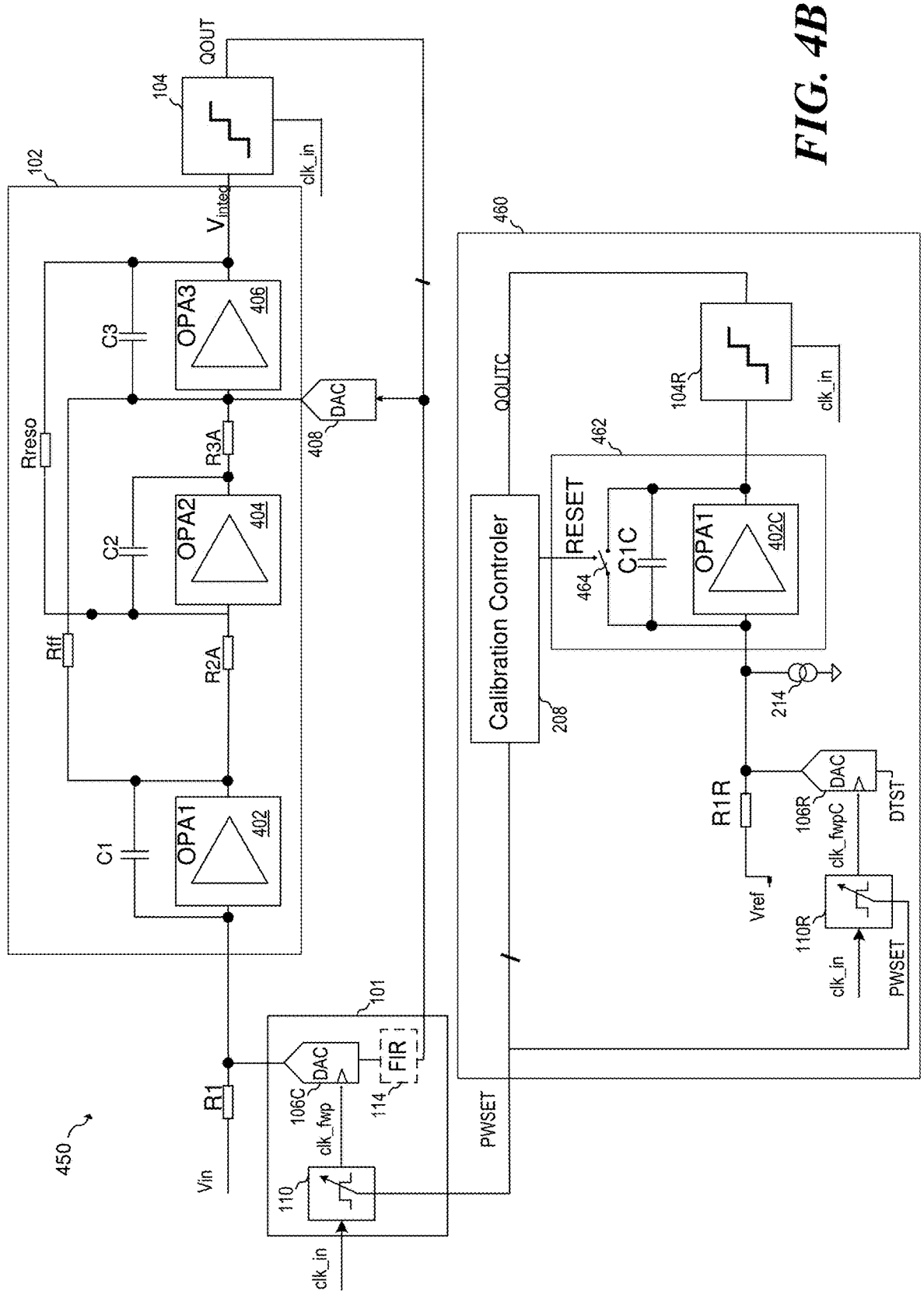

While the embodiments of FIGS. 2A and 4A are configured to adjust the pulse width of the RZ pulse produced by pulse generator 110 in the foreground (e.g. a calibration is performed at times during which the CT-DSADC does not perform conversions of input signal Vin), embodiment calibration techniques can also be applied in the background, so that the pulse width of the RZ pulse produced by pulse generator 110 is calibrated at the same time that the CT- DSADC performs conversions of input signal Vin. An example of such an embodiment is shown with respect to CT-DSADC 450 illustrated in FIG. 4B that utilizes a replica circuits.

CT-DSADC 450 includes a main continuous-time delta-sigma modulator having a continuous-time loop filter 102, quantizer 104, current DAC 101 and DAC 408. These circuits operate in a similar manner as described above with respect to FIG. 4A during normal operation of the converter. CT-DSADC 450 further includes a calibration circuit 460 that comprises replica current DAC 106R, calibration current source 214, replica pulse generation circuit 110R, integrator 462 and quantizer 104R. In various embodiments, replica current DAC 110R and replica pulse generation circuit 110R have the same or similar structure as DAC 106 and pulse generator 110 in the main continuous-time delta-sigma modulator. Calibration of the pulse width produced by replica pulse generator 110R is performed in the same or similar manner as the calibration of pulse generator 110 described above with respect to FIGS. 2A and 2B. For example, during operation, integrator 462 integrates the difference between the charge produced by replica current DAC 106R and calibration current source 214, and quantizer 104R quantizes the integrated charge difference to form quantized output QOUTC. Calibration controller 208 adjusts pulse width control signal PWSEr until quantized output QOUT C indicates that the charge produced by replica DAC 106R is close to or equal to the charge produced by calibration current source 214. At the beginning of each measurement, calibration controller 208 resets integrator 462 by shorting the capacitor C1C coupled between the input and output of operational amplifier 402C via switch 464. Next, switch 464 is opened and the difference between the charge produced by replica current DAC 106R and calibration current source 214 is integrated. Quantizer 104R evaluates the integrated charge, and calibration controller 208 updates the value of pulse width control signal PWSET for the next cycle. Since PWSET is also coupled to pulse generator 110 of the main continuous-time delta-sigma modulator, pulse generator 110 of the main continuous-time delta-sigma modulator may be updated with new values of PWSET during normal operation.

Figure 5A:
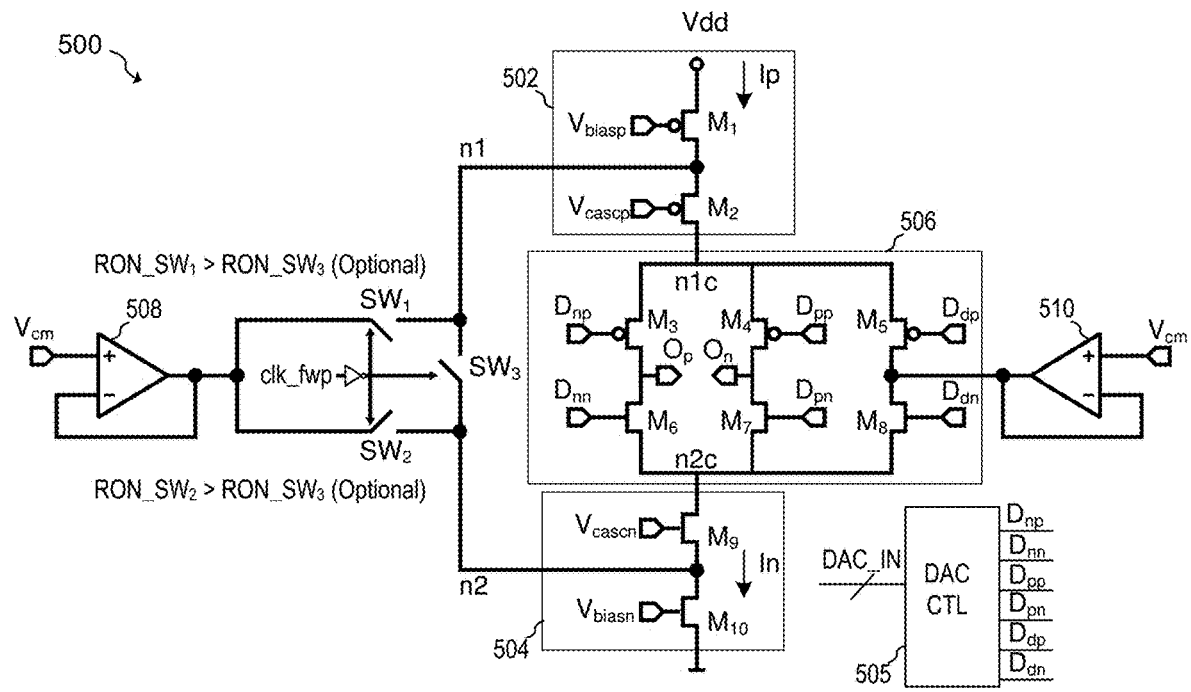
FIG. 5A illustrates a current DAC according to an embodiment.

FIG. 5A illustrates a schematic of current DAC 50o that may be used to implement current DAC 106 according to the various embodiments described above. As shown, DAC 500 includes a first cascode current source 502, a second cascode current source 504, a current switching network 506, and two amplifiers 508 and 510. During operation, various signals related to a DAC input word are applied to the gates of switching transistors M3, M4, M5, M6, M7 and M8 while shorting switch SW$_3$ is turned on via a control node coupled to RZ pulse signal clk_fwp (or the inverse of clk_fwp) depending on the implementation of shorting switch SW$_3$. This causes current Ip produced current source transistor M$_1$ and current In produced by current source transistor M$_{10}$ to bypass the current switching network 506 and flow through shorting switch SW$_3$. Bypassed current Ip flows from cascode node n1 of first cascode current source 502 to shorting switch SW$_3$, and bypassed current In flows to cascode n2 of second cascode current source 504 from shorting switch SW$_3$.

Once the DAC input word has been applied to the gates of switching transistors M3, M4, M5, M6, M7 and M8, an RZ pulse is asserted via signal clk_fwp, which causes shorting switch SW$_3$ to be open for the duration of the RZ pulse. Current Ip generated by first cascode current source 502 and In generated by second cascode current source are thus steered to switching network 506 via respective current source output nodes n1c and n2c. Depending on the state of the DAC input word, these currents are routed to DAC output nodes O$_p$ and O$_n$, or are routed to the output of amplifier 510 arranged in a unity gain buffer configuration and configured to buffer reference voltage V$_{cm}$. When the RZ pulse is de-asserted via signal clk_fwp, shorting switch SW$_3$ is closed, thereby steering currents Ip and In away from current switching network 506.

As shown, first cascode current source 502 includes current source transistor M$_1$ and cascode transistor M$_2$. Bias voltage V$_{biasp}$ is provided to the gate of current source transistor M$_1$ to provide current Ip, and bias voltage V$_{cascp}$ is provided to the gate of cascode transistor M$_2$ to provide a constant voltage to the drain of current source transistor M$_1$. Similarly, second cascode current source 504 includes current source transistor M$_{10}$ and cascode transistor M$_9$. Bias voltage V$_{biasn}$ is provided to the gate of current source transistor M$_9$ to provide current In, and bias voltage V$_{cascn}$ is provided to the gate of cascode transistor M$_9$ in order to provide a constant voltage to the drain of current source transistor M$_{10}$. Bias voltages V$_{biasp}$, V$_{cascp}$, V$_{biasn}$, and V$_{cascn}$ may be generated using bias generation circuits, such as current mirrors and cascode biasing circuits known in the art.

In the depicted embodiment, current switching network may be configured to provide three levels of current when the RZ pulse is asserted. A first level of current representing a "+1 level" (or positive current level) is achieved by turning on transistors M$_3$ and M$_7$ via DAC input signals D$_{np}$ and D$_{pn}$, and turning off transistors M$_4$, M$_6$, M$_5$ and M$_8$ via DAC input signals D$_{pp}$, D$_{nn}$, D$_{dp}$ and D$_{dn}$. This causes current Ip to be routed to output node O$_p$ via transistor M$_3$ and causes current In to be routed to output node O$_n$ via transistor M$_7$. A second level of current representing a "−1 level" (or negative current level) is achieved by turning on transistors M$_4$ and M$_6$ via DAC input signals D$_{pp}$ and D$_{nn}$, and turning off transistors M$_3$, M$_7$, M$_5$ and M$_8$ via DAC input signals D$_{np}$, D$_{pn}$, D$_{dp}$ and D$_{dn}$. This causes current Ip to be routed to output node O$_n$ via transistor M$_4$ and causes current I$_n$ to be routed to output node O$_n$ via transistor M$_6$. A third level of current representing a "0 level" (or zero current level) is achieved by turning on transistors M$_5$ and M$_8$ via DAC input signals D$_{dp}$ and D$_{dn}$, and turning off transistors M$_3$, M$_4$, M$_6$ and M$_7$ via DAC input signals D$_{np}$, D$_{pp}$, D$_{nn}$ and D$_{pn}$. This causes currents Ip and In to be routed to the output of amplifier 510, thereby preventing currents Ip and In from being routed to current DAC output nodes O$_p$ and O$_n$. In various embodiments, amplifier 510 is configured in a unity gain buffer configuration in order to buffer reference voltage V$_{cm}$ and provide a voltage level substantially equal to reference voltage V$_{cm}$ to the output of amplifier 510. In some embodiments DAC 500 includes a DAC controller 505 that maps a DAC input word DAC_IN designating particular output levels (e.g. "1 level," "−1 level," and "0 level") to DAC control signals D$_{np}$, D$_{nn}$, D$_{pp}$, D$_{pn}$, D$_{dp}$ and D$_{dn}$ in the manner described above. DAC controller 505 may be implemented using digital logic circuits known in the art.

In some embodiments, common mode switches SW$_1$ and SW$_2$ are turned on and off in unison with shorting switch SW$_3$ in order to connect cascode nodes n1 and n2 to the output of amplifier 508 (also referred to as a "first common mode reference voltage node" or "reference node") when shorting switch SW$_3$ is turned on. Similar to amplifier 508 discussed above, amplifier 510 is configured in a unity gain buffer configuration in order to buffer reference voltage V$_{cm}$ and provide a voltage level substantially equal to reference voltage $V_{cm}$ to the output of amplifier 510 at a second common mode reference voltage node. Accordingly, a defined voltage substantially equal to reference voltage $V_{cm}$ is applied to cascode nodes n1 and n2 when currents Ip and In are bypassed. In some embodiments, the on-resistances RON_SW$_1$ and RON_SW$_2$ of switches SW$_1$ and SW$_2$ are optionally made to be higher than the on-resistance RON_SW$_3$ of switch SW$_3$ to ensure that the voltages of nodes n1 and n2 during calibration do not drift too far from their operating point during normal operation. In other embodiments where the effect of drift is less severe, the on-resistance of switches SW$_1$ and SW$_2$ may be set to a resistance that is not higher than the on-resistance of switch SW$_3$.

In various embodiments, switches SW$_1$, SW$_2$ and SW$_3$ are implemented using switching circuits known in the art. For example these switches could be each be implemented using a transistor, such an MOSFET or other kind of transistor (e.g. BJT). In some embodiments, switches SW$_1$, SW$_2$ and/or SW$_3$ are implemented using a CMOS transmission gate (TGATE), which may be implemented using an NMOS device having a load path coupled in parallel with a load path of a PMOS device. In some embodiments, the width-to-length (W/L) ratios of the devices use to implement switches SW$_1$ and SW$_2$ are each smaller than the W/L ratio of switch SW$_3$ in order that the on-resistance of switches SW$_1$ and SW$_2$ is higher than the on-resistance of switch SW$_3$. Remaining devices are implemented using CMOS transistors (e.g. PMOS transistors $M_1$, $M_2$, $M_3$, $M_4$ and $M_5$ and NMOS transistors $M_6$, $M_7$, $M_8$, $M_9$ and $M_{10}$); however other device technologies (e.g. BJT) could also be used to implement these transistors.

Because no current flows from cascode current sources 502 and 504 to current switching network 506 when the DAC input word is applied, the amount of charge output by current DAC 500 is insensitive to the rise and fall times of the applied DAC control signals $D_{np}$, $D_{nn}$, $D_{pp}$, $D_{pn}$, $D_{pd}$ and $D_{dn}$, and relatively insensitive to the gate capacitances of transistors $M_3$, $M_4$, $M_5$, $M_6$, $M_7$ and $M_8$. As such, the aspect ratios of devices $M_3$, $M_4$, $M_5$, $M_6$, $M_7$ and $M_8$ could be made wide enough to have a low on resistance. This lower on resistance leads to a lower drain-source voltage across these transistors. The higher headroom resulting from the lower drain-source voltages may allow current DAC 500 to operate under very low voltage conditions. In some embodiments, DAC 500 may be operated at a supply voltage Vdd of about 1V or lower. This lower supply voltage allows for lower power operation with respect to the power consumed by DAC 500. In such embodiments, a boosted power supply for DAC 50o may be unnecessary, which also advantageously results in smaller circuit area and additional power savings.

Figure 5B:
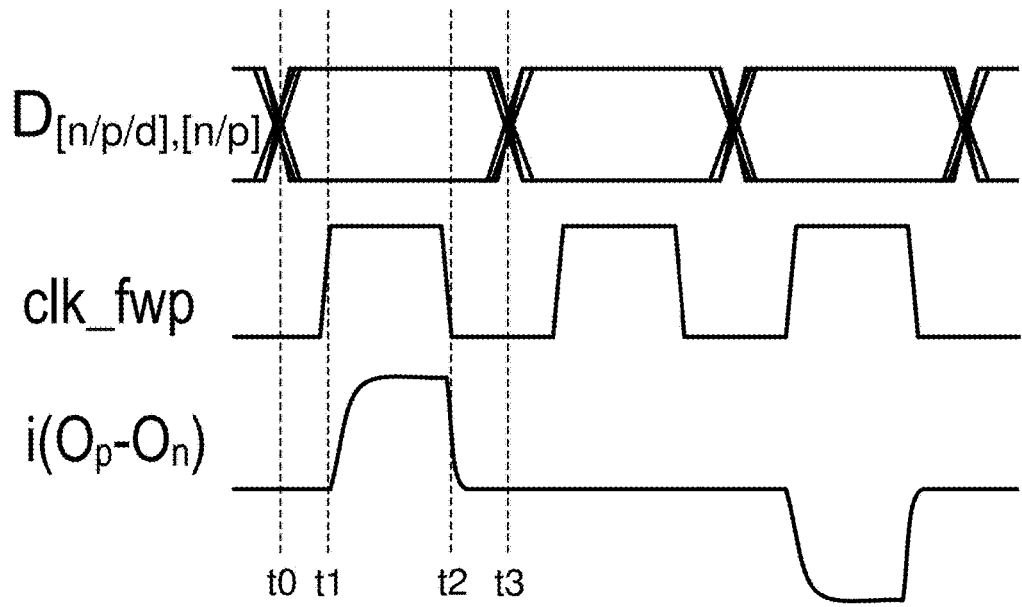
FIG. 5B illustrates a timing diagram describing the operation of the current DAC illustrated in FIG. 5A.

FIG. 5B illustrates a waveform diagram that shows the operation of current DAC 500 with respect to DAC control signals $D_{np}$, $D_{nn}$, $D_{pp}$, $D_{pn}$, $D_{pd}$ and $D_{dn}$ (represented in FIG. 5B as $D_{[n/p/d],[n/p]}$), RZ pulse signal clk_fwp, and the DAC differential output current at nodes $O_p$ and $O_n$ (represented on the figure as $i(O_p-O_n)$. As shown, DAC control signals $D_{[n/p/d],[n/p]}$ are applied at time to while RZ pulse signal clk_fwp is low. At time t1, RZ pulse signal clk_fwp is asserted, which causes output current $i(O_p-O_n)$ to flow. At time t2, RZ pulse signal clk_fwp is de-asserted, which causes output current $i(O_p-O_n)$ to stop flowing. A new set of DAC control signals $D_{[n/p/d],[n/p]}$ is applied at time t3, and the cycle is repeated.

In some embodiments, the CT-DSADC described herein may be implemented on a chip or integrated circuit. For example, all of the circuitry described above with respect to the embodiments of FIGS. 2A-2B, 3A-3C, 4A-4B and 5A-5B may be disposed on a monolithic semiconductor substrate (e.g. a silicon substrate) fabricated in one of a variety of device technologies. While embodiments of the present invention are described herein using NMOS and PMOS device that could be implemented using a CMOS technology, it should be understood that embodiments of the present invention may be implemented in other technologies using other device types. For example, JFETs and/or bipolar junction transistors BJTs may be used in place of MOS devices.

Figure 6:
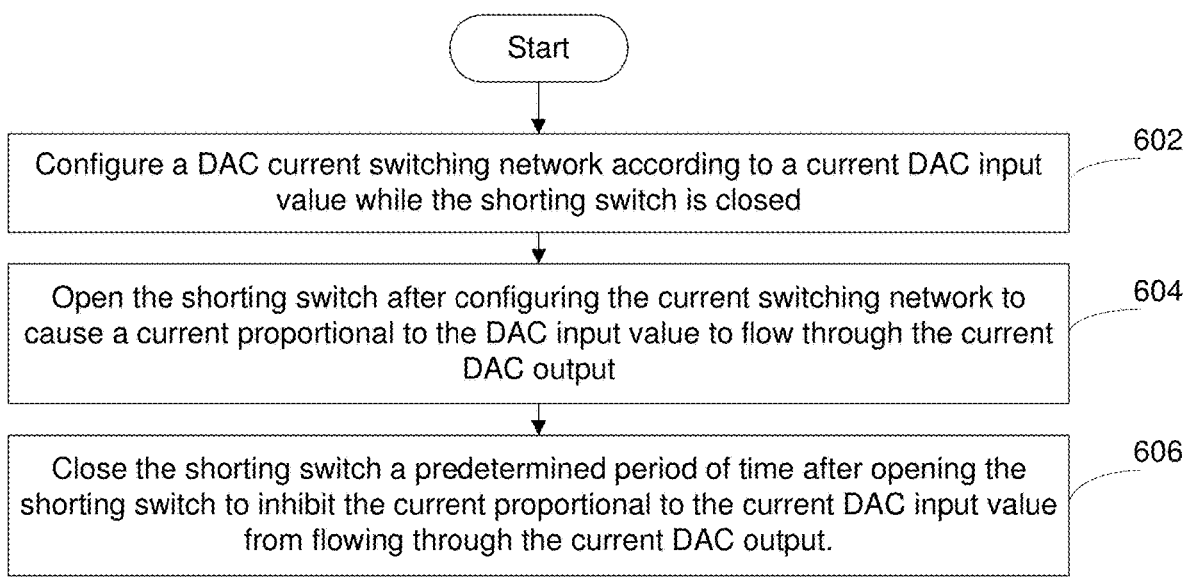
FIG. 6 illustrates a method of operating a current DAC according to an embodiment of the present invention.

FIG. 6 illustrates a flowchart of a method of operating a current DAC according to an embodiment of the present invention. In an embodiment, a current DAC includes a current switching network coupled to a current DAC output, a first cascode current source coupled between a first supply node and the current switching network, a second cascode current source coupled between a second supply node and the current switching network, and a shorting switch coupled between a first cascode node of the first cascode current source, and a second cascode node of the second cascode current source. In some embodiments, current DAC 500 described above with respect to FIGS. 5A-5B could be used. In step 602, the current switching network is configured while the shorting switch is closed. For example, in the embodiment of FIG. 5A, the current switching network 506 is configured by applying a DAC input word to the gates of transistors $M_3$, $M_4$, $M_5$, $M_6$, $M_7$ and $M_8$.

Next, in step 604, the shorting switch is opened, which causes a current proportional to the DAC input value to flow through the current DAC output. For example, in the embodiment of FIG. 5A, a current specified by the DAC input word flows through output nodes $O_p$ and $O_n$ when shorting switch SW$_3$ is opened in response to RZ pulse signal clk_fwp being asserted. In step 606, the shorting switch is closed a predetermined period of time after opening the shorting switch to inhibit the current proportional to the DAC input value from flowing through the current DAC output. In the embodiment of FIG. 5A, this occurs when shorting switch SW$_3$ is closed in response to RZ pulse signal clk_fwp being de-asserted, which causes currents Ip and In are steered away from current switching network 506. The predetermined period of time may be set using pulse generator 110 described in embodiments above.

Embodiments of the present invention are summarized here. Other embodiments can also be understood from the entirety of the specification and the claims filed herein.

Example 1. A circuit including: a current digital-to-analog converter (DAC), where the current DAC includes a current switching network coupled to a current DAC output, a first cascode current source coupled between a first supply node and the current switching network, a second cascode current source between a second supply node and the current switching network, and a shorting switch coupled between a first cascode node of the first cascode current source, and a second cascode node of the second cascode current source.

Example 2. The circuit of example 1, further including a control circuit coupled to the current DAC, where the control circuit is configured to: configure the current switching network according to a current DAC input value while the shorting switch is closed; open the shorting switch after configuring the current switching network to cause a current proportional to the current DAC input value to flow through the current DAC output; and close the shorting switch a predetermined period of time after opening the shorting switch to inhibit the current proportional to the DAC input value from flowing through the current DAC output.

Example 3. The circuit of one of examples 1 or 2, further including a tunable delay element configured to determine the predetermined period of time.

Example 4. The circuit of one of examples 1 to 3, where: the first cascode current source includes a first cascode transistor coupled to the current switching network, and a first current source transistor coupled to the first cascode transistor at the first cascode node; and the second cascode current source includes a second cascode transistor coupled to the current switching network, and a second current source transistor coupled to the second cascode transistor at the second cascode node.

Example 5. The circuit of one of examples 1 to 4, where the current switching network includes: a first plurality of switching transistors coupled between the first cascode current source and the current DAC output; and a second plurality of switching transistors coupled between the second cascode current source and the current DAC output.

Example 6. The circuit of one of examples 1 to 5, further including a first switching transistor coupled between the first cascode current source and a first common mode reference voltage node, and a second switching transistor coupled between the second cascode current source and the first common mode reference voltage node.

Example 7. The circuit of one of examples 1 to 6, further including a first common mode switch coupled between a second common mode reference voltage node and the first cascode node, and a second common mode switch coupled between the second common mode reference voltage node and the second cascode node.

Example 8. The circuit of one of examples 1 to 7, further including: at least one continuous-time integrator coupled to the current DAC; and a comparator having an input coupled to the at least one continuous-time integrator and an output coupled to the DAC, where the DAC, the at least one continuous-time integrator, and the comparator form a continuous-time delta-sigma modulator.

Example 9. A method of operating a current digital-to-analog converter (DAC) including a current switching network coupled to a current DAC output, a first cascode current source coupled between a first supply node and the current switching network, a second cascode current source between a second supply node and the current switching network, and a shorting switch coupled between a first cascode node of the first cascode current source, and a second cascode node of the second cascode current source, the method including: configuring the current switching network according to a current DAC input value while the shorting switch is closed; opening the shorting switch after configuring the current switching network to cause a current proportional to the DAC input value to flow through the current DAC output; and closing the shorting switch a predetermined period of time after opening the shorting switch to inhibit the current proportional to the current DAC input value from flowing through the current DAC output.

Example 10. The method of example 9, further including: opening a first common mode switch and a second common mode switch when opening the shorting switch, where the first common mode switch is coupled between a second common mode reference voltage node and the first cascode node, and the second common mode switch is coupled between the second common mode reference voltage node and the second cascode node; and closing the first common mode switch and the second common mode switch when closing the shorting switch.

Example 11. The method of one of examples 9 or 10, where closing the shorting switch the predetermined period of time after opening the shorting switch includes delaying a switch control signal to the shorting switch using an adjustable delay circuit.

Example 12. The method of example 11, further including calibrating the adjustable delay circuit.

Example 13. The method of example 12, where calibrating the adjustable delay circuit includes: integrating a difference between an output current of the current DAC and a reference current; and adjusting a delay of the adjustable delay circuit based on the integrated difference.

Example 14. The method of example 12, where calibrating the adjustable delay circuit includes: integrating a difference between an output current of a replica current DAC and a reference current, where the replica current DAC has a same structure as the current DAC; and adjusting a delay of the programmable delay element based on the integrated difference.

Example 15. A continuous-time delta-sigma converter, including: at least one continuous-time integrator, a comparator coupled to an output of the at least one continuous-time integrator; and a current DAC including: a first current source coupled to an output of the current DAC via a first switch at a first current source output node, a second current source coupled to the output of the current DAC via a second switch at a second current source output node, a shorting switch coupled between a first internal node of the first current source, and a second internal node of the second current source, and a programmable pulse generator coupled to a control node of the shorting switch, where the programmable pulse generator is configured to gate an output current of the current DAC by opening the shorting switch for a predetermined period of time.

Example 16. The continuous-time delta-sigma converter of example 15, further including a third switch coupled between a reference node and the first current source output node, and a fourth switch coupled between the reference node and the second current source output node.

Example 17. The continuous-time delta-sigma converter of one of examples 15 or 16, further including a DAC controller configured to apply DAC control signals to the first switch, the second switch, the third switch, and the fourth switch, and to activate the programmable pulse generator after applying the DAC control signals.

Example 18. The continuous-time delta-sigma converter of one of examples 15 to 17, further including: a first common mode switch having a load path coupled between the first internal node of the first current source and a control node coupled to the programmable pulse generator; and a second common mode switch having a load path coupled between the second internal node of the second current source and a control node coupled to the programmable pulse generator.

Example 19. The continuous-time delta-sigma converter of one of examples 15 to 18, where the first current source and the second current source each include a cascode current source; the first switch includes a first plurality of CMOS transistors; the second switch includes a second plurality of CMOS transistors; and the shorting switch includes a CMOS transmission gate.

Example 20. The continuous-time delta-sigma converter of one of examples 15 to 19, further including a calibration circuit configured to calibrate the programmable pulse generator.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
 a current digital-to-analog converter (DAC), wherein the current DAC comprises
  a current switching network coupled to a current DAC output,
  a first cascode current source coupled between a first supply node and the current switching network,
  a second cascode current source between a second supply node and the current switching network, and
  a shorting switch coupled between a first cascode node of the first cascode current source, and a second cascode node of the second cascode current source.

2. The circuit of claim 1, further comprising a control circuit coupled to the current DAC, wherein the control circuit is configured to:
 configure the current switching network according to a current DAC input value while the shorting switch is closed;
 open the shorting switch after configuring the current switching network to cause a current proportional to the current DAC input value to flow through the current DAC output; and
 close the shorting switch a predetermined period of time after opening the shorting switch to inhibit the current proportional to the current DAC input value from flowing through the current DAC output.

3. The circuit of claim 2, further comprising a tunable delay element configured to determine the predetermined period of time.

4. The circuit of claim 1, wherein:
 the first cascode current source comprises a first cascode transistor coupled to the current switching network, and a first current source transistor coupled to the first cascode transistor at the first cascode node; and
 the second cascode current source comprises a second cascode transistor coupled to the current switching network, and a second current source transistor coupled to the second cascode transistor at the second cascode node.

5. The circuit of claim 1, wherein the current switching network comprises:
 a first plurality of switching transistors coupled between the first cascode current source and the current DAC output; and
 a second plurality of switching transistors coupled between the second cascode current source and the current DAC output.

6. The circuit of claim 5, further comprising a first switching transistor coupled between the first cascode current source and a first common mode reference voltage node, and a second switching transistor coupled between the second cascode current source and the first common mode reference voltage node.

7. The circuit of claim 1, further comprising a first common mode switch coupled between a second common mode reference voltage node and the first cascode node, and a second common mode switch coupled between the second common mode reference voltage node and the second cascode node.

8. The circuit of claim 1, further comprising:
 at least one continuous-time integrator coupled to the current DAC; and
 a comparator having an input coupled to the at least one continuous-time integrator and an output coupled to the DAC, wherein the DAC, the at least one continuous-time integrator, and the comparator form a continuous-time delta-sigma modulator.

9. A method of operating a current digital-to-analog converter (DAC) comprising a current switching network coupled to a current DAC output, a first cascode current source coupled between a first supply node and the current switching network, a second cascode current source between a second supply node and the current switching network, and a shorting switch coupled between a first cascode node of the first cascode current source, and a second cascode node of the second cascode current source, the method comprising:
 configuring the current switching network according to a current DAC input value while the shorting switch is closed;
 opening the shorting switch after configuring the current switching network to cause a current proportional to the current DAC input value to flow through the current DAC output; and
 closing the shorting switch a predetermined period of time after opening the shorting switch to inhibit the current proportional to the current DAC input value from flowing through the current DAC output.

10. The method of claim 9, further comprising:
 opening a first common mode switch and a second common mode switch when opening the shorting switch, wherein the first common mode switch is coupled between a second common mode reference voltage node and the first cascode node, and the second common mode switch is coupled between the second common mode reference voltage node and the second cascode node; and
 closing the first common mode switch and the second common mode switch when closing the shorting switch.

11. The method of claim 9, wherein closing the shorting switch the predetermined period of time after opening the shorting switch comprises delaying a switch control signal to the shorting switch using an adjustable delay circuit.

12. The method of claim 11, further comprising calibrating the adjustable delay circuit.

13. The method of claim 12, wherein calibrating the adjustable delay circuit comprises:
 integrating a difference between an output current of the current DAC and a reference current; and
 adjusting a delay of the adjustable delay circuit based on the integrated difference.

14. The method of claim 12, wherein calibrating the adjustable delay circuit comprises:
 integrating a difference between an output current of a replica current DAC and a reference current, wherein the replica current DAC has a same structure as the current DAC; and
 adjusting a delay of the adjustable delay circuit based on the integrated difference.

15. A continuous-time delta-sigma converter, comprising:
 at least one continuous-time integrator;
 a comparator coupled to an output of the at least one continuous-time integrator; and a current DAC comprising:
- a first current source coupled to an output of the current DAC via a first switch at a first current source output node,
- a second current source coupled to the output of the current DAC via a second switch at a second current source output node,
- a shorting switch coupled between a first internal node of the first current source, and a second internal node of the second current source, and
- a programmable pulse generator coupled to a control node of the shorting switch, wherein the programmable pulse generator is configured to gate an output current of the current DAC by opening the shorting switch for a predetermined period of time.

16. The continuous-time delta-sigma converter of claim 15, further comprising a third switch coupled between a reference node and the first current source output node, and a fourth switch coupled between the reference node and the second current source output node.

17. The continuous-time delta-sigma converter of claim 16, further comprising a DAC controller configured to apply DAC control signals to the first switch, the second switch, the third switch, and the fourth switch, and to activate the programmable pulse generator after applying the DAC control signals.

18. The continuous-time delta-sigma converter of claim 15, further comprising:
- a first common mode switch having a load path coupled between the first internal node of the first current source and a control node coupled to the programmable pulse generator; and
- a second common mode switch having a load path coupled between the second internal node of the second current source and a control node coupled to the programmable pulse generator.

19. The continuous-time delta-sigma converter of claim 15, wherein
- the first current source and the second current source each comprise a cascode current source;
- the first switch comprises a first plurality of CMOS transistors;
- the second switch comprises a second plurality of CMOS transistors; and
- the shorting switch comprises a CMOS transmission gate.

20. The continuous-time delta-sigma converter of claim 15, further comprising a calibration circuit configured to calibrate the programmable pulse generator.

* * * * *